(12) United States Patent
Kean

(10) Patent No.: US 11,206,000 B1
(45) Date of Patent: Dec. 21, 2021

(54) FILTERLESS HIGH EFFICIENCY CLASS D POWER AMPLIFIER

(71) Applicant: Rockwell Collins, Inc., Cedar Rapids, IA (US)

(72) Inventor: Timothy L. Kean, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 218 days.

(21) Appl. No.: 16/696,304

(22) Filed: Nov. 26, 2019

(51) Int. Cl.
*H03F 3/21* (2006.01)
*H03F 3/217* (2006.01)

(52) U.S. Cl.
CPC ..... *H03F 3/2171* (2013.01); *H03F 2200/384* (2013.01)

(58) Field of Classification Search
CPC .................................................. H03F 3/2171
See application file for complete search history.

(56) References Cited

U.S. PATENT DOCUMENTS

| | | | |
|---|---|---|---|
| 6,614,297 B2 | 9/2003 | Score et al. | |
| 6,847,257 B2 | 1/2005 | Edwards et al. | |
| 6,970,123 B1 | 11/2005 | Sahandiesfanjani | |
| 6,985,034 B1 | 1/2006 | Prokin et al. | |
| 7,119,629 B2 | 10/2006 | Nielsen et al. | |
| 7,332,962 B2 | 2/2008 | Wu et al. | |
| 7,659,789 B2 | 2/2010 | Zhu et al. | |
| 7,702,120 B1 | 4/2010 | Ferstenberg | |
| 7,859,337 B1 | 12/2010 | Chu et al. | |
| 7,924,089 B2 | 4/2011 | Tanaka et al. | |
| 8,164,382 B2 | 4/2012 | Teplechuk | |
| 8,164,387 B1 * | 4/2012 | Apel | H03F 3/3076 330/276 |
| 8,289,085 B2 | 10/2012 | Tajima et al. | |
| 8,766,713 B2 | 7/2014 | Lin | |
| 9,548,704 B1 | 1/2017 | Ben-Yishay et al. | |
| 9,685,919 B2 * | 6/2017 | Yuan | H03F 3/2175 |
| 2004/0232978 A1 | 11/2004 | Easson et al. | |
| 2007/0146069 A1 * | 6/2007 | Wu | H03K 7/08 330/251 |

(Continued)

FOREIGN PATENT DOCUMENTS

| | | |
|---|---|---|
| CN | 109347451 A | 2/2019 |
| JP | H11324466 A | 11/1999 |
| WO | 2016201897 A1 | 12/2016 |

*Primary Examiner* — Patricia T Nguyen
(74) *Attorney, Agent, or Firm* — Suiter Swantz pc llo

(57) ABSTRACT

A filterless high-efficiency class D power amplifier (HEPA) exploits the phase relationships of even and odd harmonics at transistor drains of a push-pull topology to eliminate output filtering, enabling an ultra-high-efficiency, low harmonic signal. The filterless HEPA relieves the amplifier of a requirement for a power consuming filter by implementing a high-quality operational harmonic block on an output stage without output buffering. The operational harmonic block senses the voltage source radio frequency to the amplifier prior to waveform squaring and employs a harmonic canceling balun to block even harmonics (in-phase) but pass odd harmonics (180° out of phase). The sensed ideal voltage source shunts the odd-harmonic currents to ground, leaving only the fundamental current on its primary to pass to the load.

15 Claims, 9 Drawing Sheets

(56) References Cited

U.S. PATENT DOCUMENTS

| | | | |
|---|---|---|---|
| 2007/0206395 A1* | 9/2007 | Lincoln | H02M 7/5387 363/56.1 |
| 2008/0030267 A1* | 2/2008 | Yang | H03F 1/26 330/10 |
| 2015/0372645 A1* | 12/2015 | Banerjee | H03F 1/0294 330/251 |
| 2016/0099685 A1* | 4/2016 | Babaie | H01F 27/2823 330/251 |
| 2018/0097486 A1 | 4/2018 | Salem et al. | |

* cited by examiner

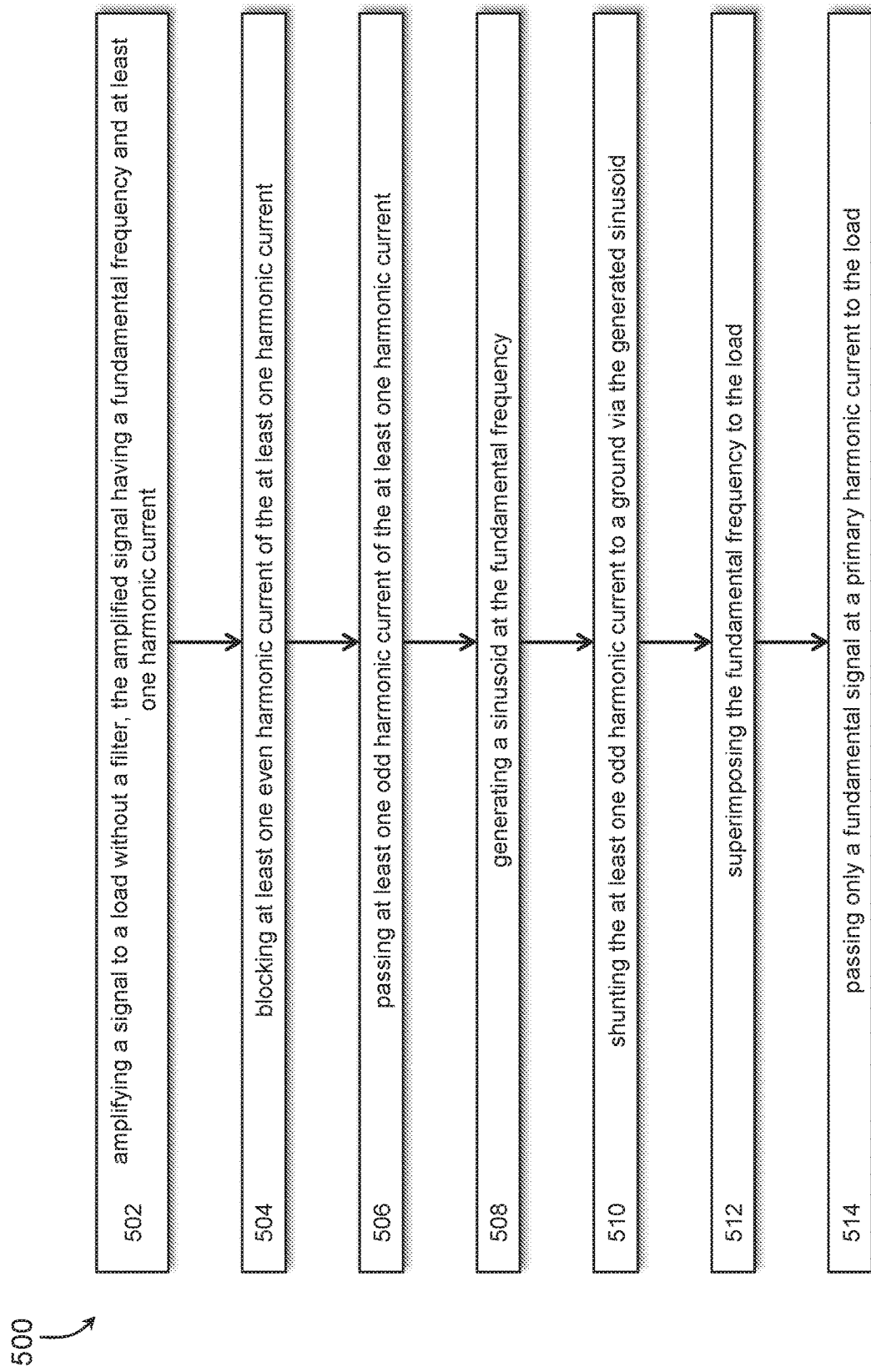

FILTERLESS HIGH EFFICIENCY CLASS D POWER AMPLIFIER

BACKGROUND

One obstacle to obtaining highly efficient and spectrally clean radio frequency (RF) power amplification are the losses associated with RF output filtering. Besides reducing the direct current (DC) to fundamental RF conversion efficiency, RF filtering increases the amplifier's size, weight, cost, and complexity, while reducing its reliability. A multioctave, band-switched filter also lowers the frequency agility of the unit, with band transitions being required every octave at a minimum.

High Efficiency (Switching) Power Amplifiers (PA) may generate high levels of undesirable harmonics. In traditional power amplifiers, harmonics may be filtered from the desired signal using legacy output filtering.

Some PA filters may comprise a substantial portion of the total weight of the whole PA while others may cause a power loss of approximately 0.7 dB and a create a requirement for band switching causing an even further power loss. Output filtering may also limit a frequency agility while increasing size, cost, and complexity which ultimately decreases overall reliability.

Two common switch-mode power amplifier configurations may be duals of one another: a Current Switching, or Current Mode PA (CMPA) and a Voltage Switching, or Voltage Mode PA (VMPA). Each of the CMPA and VMPA may inherently possess similar undesirable harmonics which must be eliminated before the resulting output signal may be useful.

Therefore, a need remains for a system and related method which may overcome these limitations and provide a novel solution to eliminating a filter from a PA and implementing a powered block of the undesirable harmonics.

SUMMARY

In one aspect, embodiments of the inventive concepts disclosed herein are directed to a filterless high efficiency power amplification (HEPA) device. The HEPA may comprise a power amplifier (PA) configured to amplify a signal to a load. The PA may include an output stage for the amplified signal without a filter where the amplified signal may have a fundamental frequency and one or more harmonic currents.

The filterless HEPA may include an operational harmonic block coupled with the output stage of the PA, the operational harmonic block including a first transformer coupled to the output path of the PA, the first transformer configured to block each even harmonic current of the harmonic currents. Here, the first transformer may further be configured to pass an odd harmonic current of the harmonic currents.

The filterless HEPA may include an ideal source having a low impedance and coupled with the first transformer, the ideal source configured for generating a sinusoid at the fundamental frequency, the ideal source also configured to shunt the odd harmonic current to ground. Also, a second transformer may be coupled with the output path in parallel or series with the first transformer and at a point downstream of the operational harmonic block. The second transformer may be configured to superimpose the fundamental frequency to the load. Here, the operational harmonic block may function to pass only a fundamental signal at a primary harmonic current to the load via the second transformer.

A further embodiment of the inventive concepts disclosed herein may include a method for filterless high efficiency power amplification. The method may comprise amplifying a signal to a load without a filter, the amplified signal having a fundamental frequency and a harmonic current. Here, at a position proximal with an output stage prior to the load, the method may include blocking an even harmonic current of the harmonic currents and passing an odd harmonic current of the harmonic currents. The method may further include generating a sinusoid at the fundamental frequency and shunting the odd harmonic currents to ground. The method may also include superimposing the fundamental frequency to the load and passing only a fundamental signal at a primary harmonic current to the load.

It is to be understood that both the foregoing general description and the following detailed description are exemplary and explanatory only and are not necessarily restrictive of the inventive concepts as claimed. The accompanying drawings, which are incorporated in and constitute a part of the specification, illustrate embodiments of the inventive concepts and together with the general description, serve to explain the principles of the inventive concepts disclosed herein.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings in which

FIG. 5 is a diagram of a method flow in accordance with one embodiment of the inventive concepts disclosed herein.

DETAILED DESCRIPTION OF EXEMPLARY EMBODIMENTS

Figure 1:
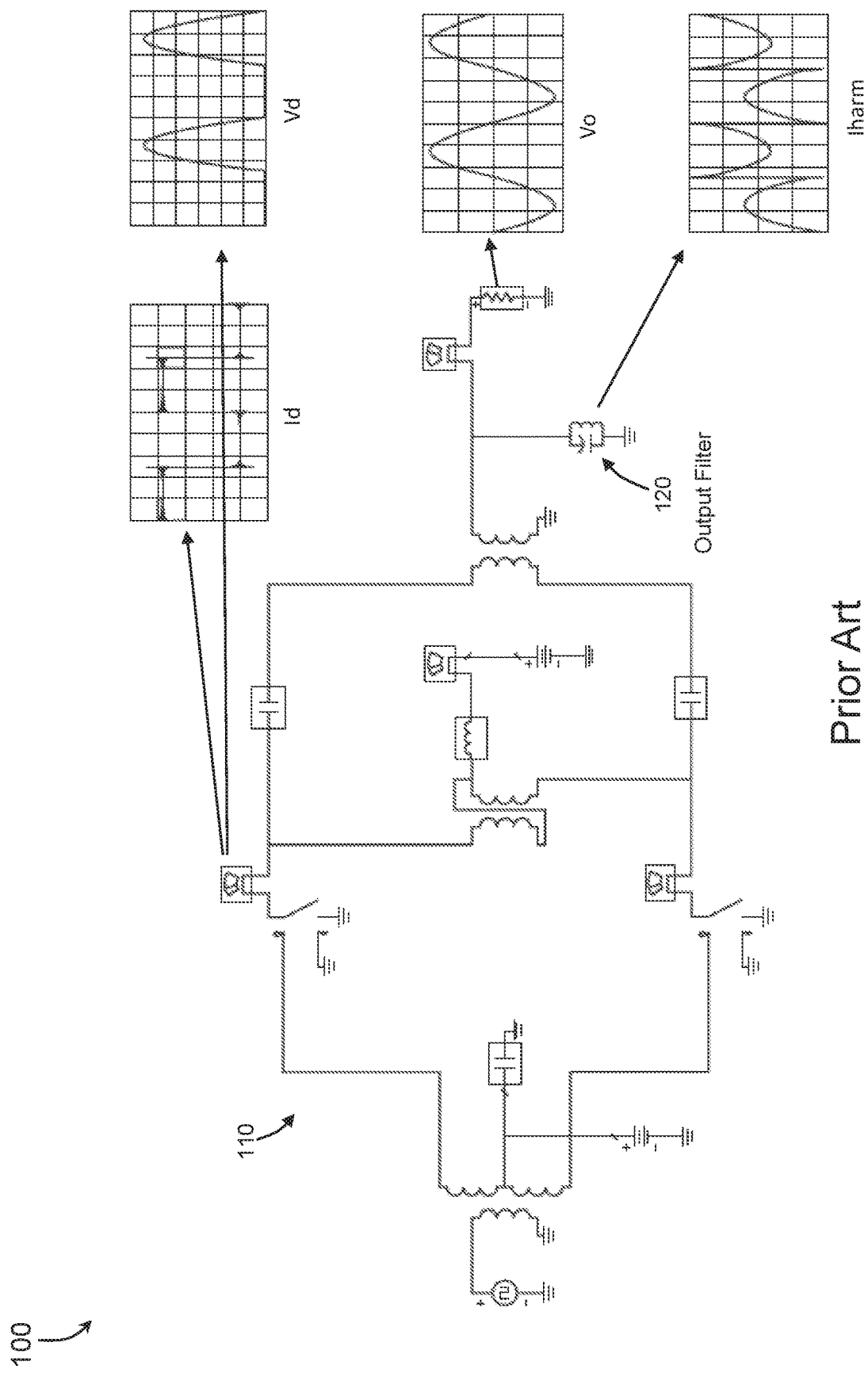
FIG. 1 is a diagram of a prior art CMPA with filter.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, thus "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Overview

Broadly, embodiments of the inventive concepts disclosed herein are directed to a filterless high-efficiency class D power amplifier (HEPA) which exploits the phase relationships of even and odd harmonics at transistor drains of a push-pull topology to eliminate output filtering, enabling an ultra-high-efficiency, low harmonic signal. The filterless HEPA relieves the amplifier of a requirement for a power consuming filter by implementing a high-quality operational harmonic block on an output stage without output buffering. The operational harmonic block senses the voltage source radio frequency to the amplifier prior to waveform squaring and employs a harmonic canceling balun to block even harmonics (in-phase) but pass odd harmonics (180° out of phase). The sensed ideal voltage source shunts the odd-harmonic currents to ground, leaving only the fundamental current on its primary to pass to the load.

A filterless HEPA may employ two transformer baluns connected in either parallel or series on the push-pull output stage each provide high impedances to the in-phase even harmonic currents. The output of one of a first transformer may connect to an ideal low-impedance voltage or high-impedance current source set to the same amplitude, phase and frequency as the fundamental signal. The odd harmonics and fundamental currents of each transformer are 180° out of phase with each other, allowing the transformer to provide a low impedance, resulting in the harmonics being shorted to ground by the low-impedance voltage source. The ultra-high-efficiency aspect of the filterless PA reduces size, weight, power, and cost while improving reliability due to lower temperatures. Eliminating the RF output filtering also improves reliability due to a much lower component count. Furthermore, since no RF filtering or band switching is needed, the PA can operate with agility over a wide frequency range.

| REFERENCE CHART | |
|---|---|
| 100 | Prior Art CMPA |
| 110 | Traditional PA |
| 120 | Output Filter |
| 200 | CMPA Embodiment |
| 210 | CMPA |
| 212 | Output Stage |
| 214 | CMPA Voltage Source |
| 216 | Load |
| 220 | Operational Harmonic Block |
| 222 | First Transformer |
| 224 | Ideal Power Source |
| 226 | Second Transformer |
| 234 | Connector |
| 240 | Fundamental |
| 242 | Fist Harmonic |
| 300 | Prior Art VMPA |
| 400 | VMPA Embodiment |
| 410 | VMPA |
| 414 | Current Source |
| 424 | Ideal Current Source |
| 500 | Method Flow |
| 502 | Amplifying |
| 504 | Blocking |
| 506 | Passing |
| 508 | Generating |
| 510 | Shunting |
| 512 | Superimposing |
| 514 | Passing |

FIG. 1 Prior Art CMPA

Referring now to FIG. 1, a diagram of a prior art CMPA with filter is shown for reference.

FIGS. 2 A-C CMPA

Figure 2A:
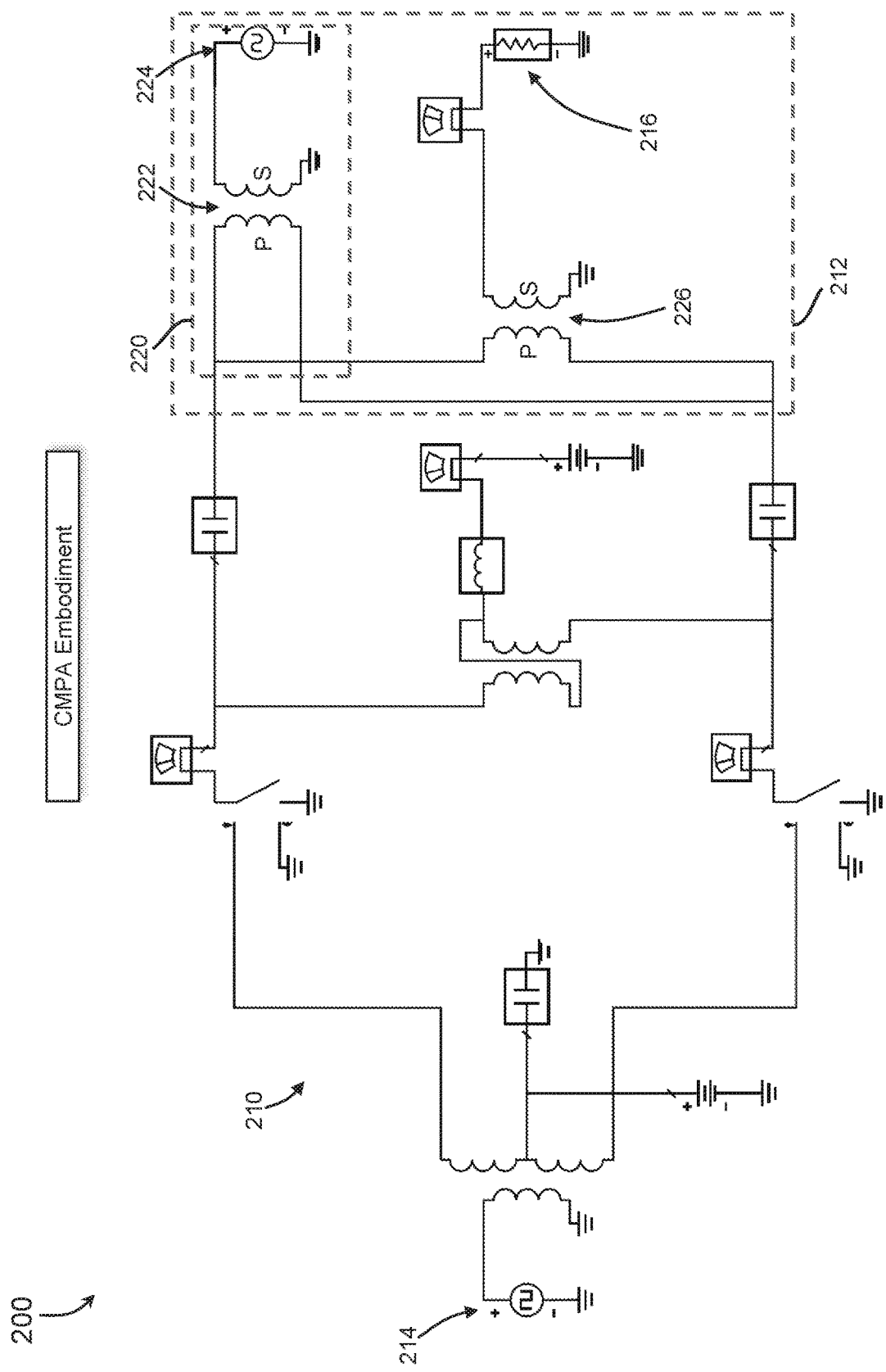
FIGS. 2A-2C are diagrams of a filterless CMPA in accordance with an embodiment of the inventive concepts disclosed herein.
Figure 2B:
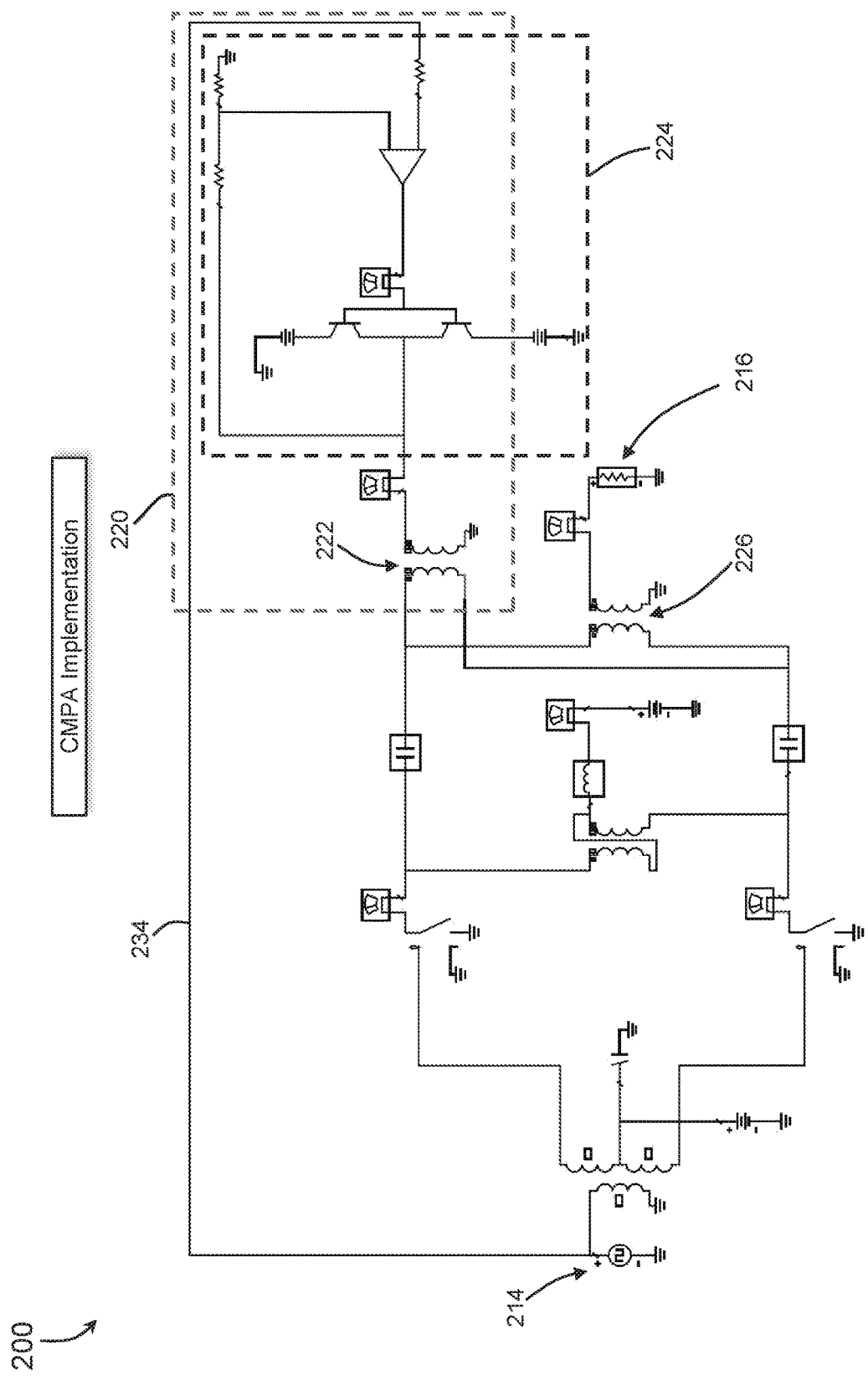
Figure 2C:
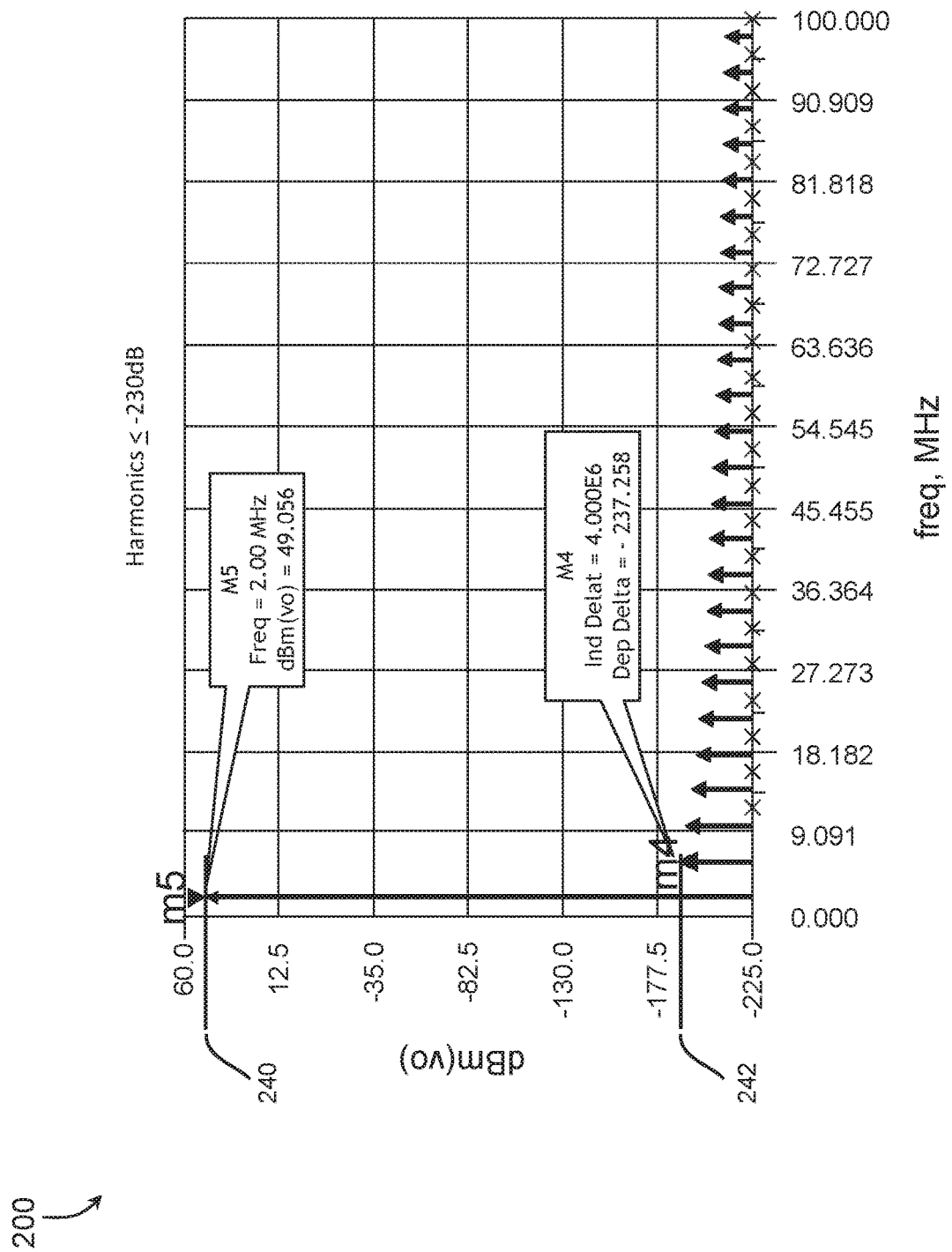

Referring now to FIGS. 2A-C, diagrams of a filterless CMPA in accordance with an embodiment of the inventive concepts disclosed herein are shown. A CMPA embodiment 200 may employ a PA 210 having a CMPA voltage source 214, an output stage 212, and a load 216. The output stage 212 may include an operational harmonic block 220 including a first transformer 222 coupled with an ideal voltage source 224. The output stage 212 may further include a second transformer 226 coupled (here, in parallel) downstream of the first transformer 222. As the harmonic currents may flow through the CMPA 210 the operational harmonic block 220 may function to either block or shunt each of the harmonics enabling a fundamental current passage to the load 216.

The harmonics of each of the CMPA and VMPA may have similarities including: 1) the waveforms of the transistor drain current and voltage may be square-waves, which contain the fundamental and all odd harmonics, 2) the waveforms of the transistor current and voltage are half-sinusoidal signals, which contain the fundamental harmonic and all even harmonics, 3) the fundamental harmonic and all odd harmonics present at the drains of the two transistors are 180 degrees out-of-phase with each other, and 4) all even harmonics present at the drains of the two transistors are in-phase with each other.

Dependent on whether the push pull PA is one of a CMPA or VMPA, an output path transistor drain may present a square waveform in either of current in the CMPA or voltage in the VMPA.

CMPA Basis

The characteristics of the CMPA embodiment 200 (e.g., a push pull CMPA) may include current waveforms present within drains of each of the transformers 222 226 within the output stage 212 which may represent a square wave containing the fundamental and all odd harmonics. The transformer 222 226 voltage waveforms may be half-sinusoidal signals which contain the fundamental and all even harmonics. Here, the fundamental and all odd harmonics present at the output stage 212 transformers 222 226 drains may be 180 degrees out of phase with the even harmonics present. Also, all even harmonics present at the drains of the two transformers 222 226 may be in phase with each other.

The CMPA embodiment 200 may use no output filter acting as a shunt Inductor Capacitor (LC) network within the output stage 212 to the load 216.

In one embodiment of the inventive concepts disclosed herein, the first transformer 222 of the operational harmonic block 220 may function as an output amplifier to present a high impedance to common-mode currents and low impedance to differential-mode currents. Within the common-mode current, both currents (a signal and a return) at the ports may be in the same direction (e.g., in-phase). Whereas within differential-mode current, the currents (signal and return) at the balun ports may be in opposite directions (e.g., out-of-phase). The first transformer 222 may function as a balun and present a high impedance to the common mode current to block the even harmonics from flowing to the load 216. However, the first transformer 222 may have a low impedance to the odd harmonics and may be unable to block the odd harmonics since the odd harmonics are out of phase.

In one embodiment of the inventive concepts disclosed herein, the ideal voltage source 224 within the operational harmonic block 220 may function to operate at the fundamental signal, maintaining a very low source impedance (a high impedance to the common mode current), and may perform at least two tasks including 1) shunting all the odd harmonics to ground, and 2) generating a sinusoid at the fundamental frequency which may act to impede the same fundamental signal flowing through a primary side (P) of the first transformer 222.

In one embodiment of the inventive concepts disclosed herein, the second transformer 226 may function to superimpose the fundamental current which is the only current which may reside in a primary side of the second transformer 226, to the secondary (S) side of the second transformer 226 allowing the fundamental current to pass to the load 216 generating the output power. Since the first 222 and the second 226 transformers are in parallel, the second transformer 226 may function to pass the fundamental current to the load 216 generating the power.

FIG. 2B CMPA Implementation

In one embodiment of the inventive concepts disclosed herein, the ideal voltage source 224 may receive a sensing signal from the CMPA source via a connector 234 from the CMPA voltage source 214 to synchronize the ideal voltage source 224 within the operational harmonic block 220. Alternatively, the CMPA voltage source 214 may be the ideal voltage source and function to supply the operational harmonic block 220 with the ideal voltage source via the connector 234 to present the low impedance to the undesirable harmonics passing through the output stage 212.

FIG. 2C CMPA Results

FIG. 2C may indicate a delta, as a result of the operational harmonic block 220 and the second transformer 226, between the fundamental 240 and the first harmonic 242 of approximately 237 dBm. At an exemplary CMPA 210 source frequency of 2 MHz, the ideal voltage source 224 may also generate the sinusoid at 2 MHz.

Applying the operational harmonic block 220, the CMPA 210 may function to suppress each of the harmonics leaving the fundamental current. With a delta of greater than 230 dB, the operational harmonic block 220 may function to eliminate each of the even and odd harmonics from the fundamental current and offer a desirable delta between the fundamental (m5) and the nearest harmonic (m4) offering a clean output waveform to the load 216.

Figure 3:
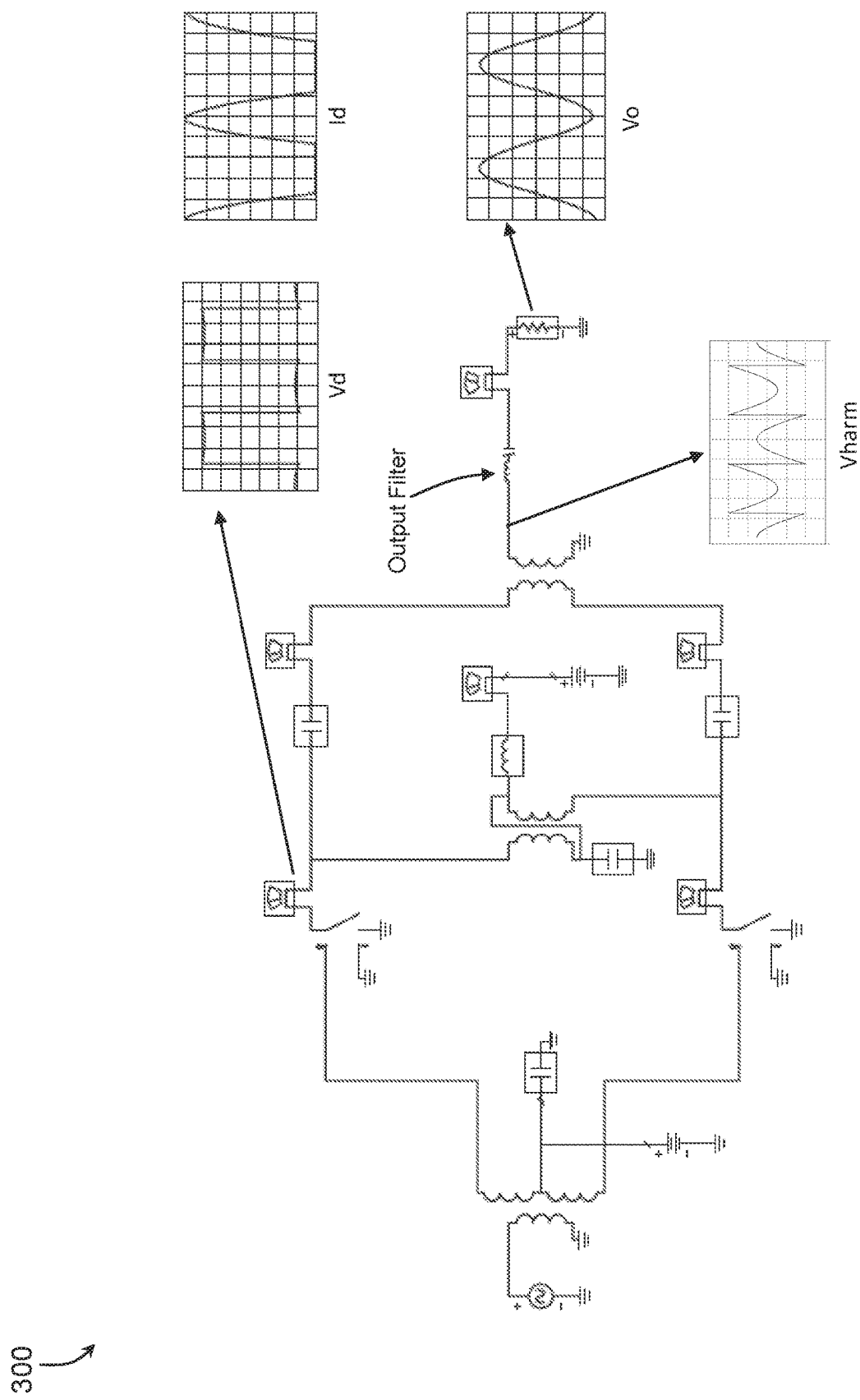
FIG. 3 is a diagram of a prior art VMPA with filter.

FIG. 3 Prior Art VMPA

Referring now to FIG. 3, a diagram of a prior art VMPA with filter is shown for reference.

FIGS. 4 A-C VMPA

Figure 4A:
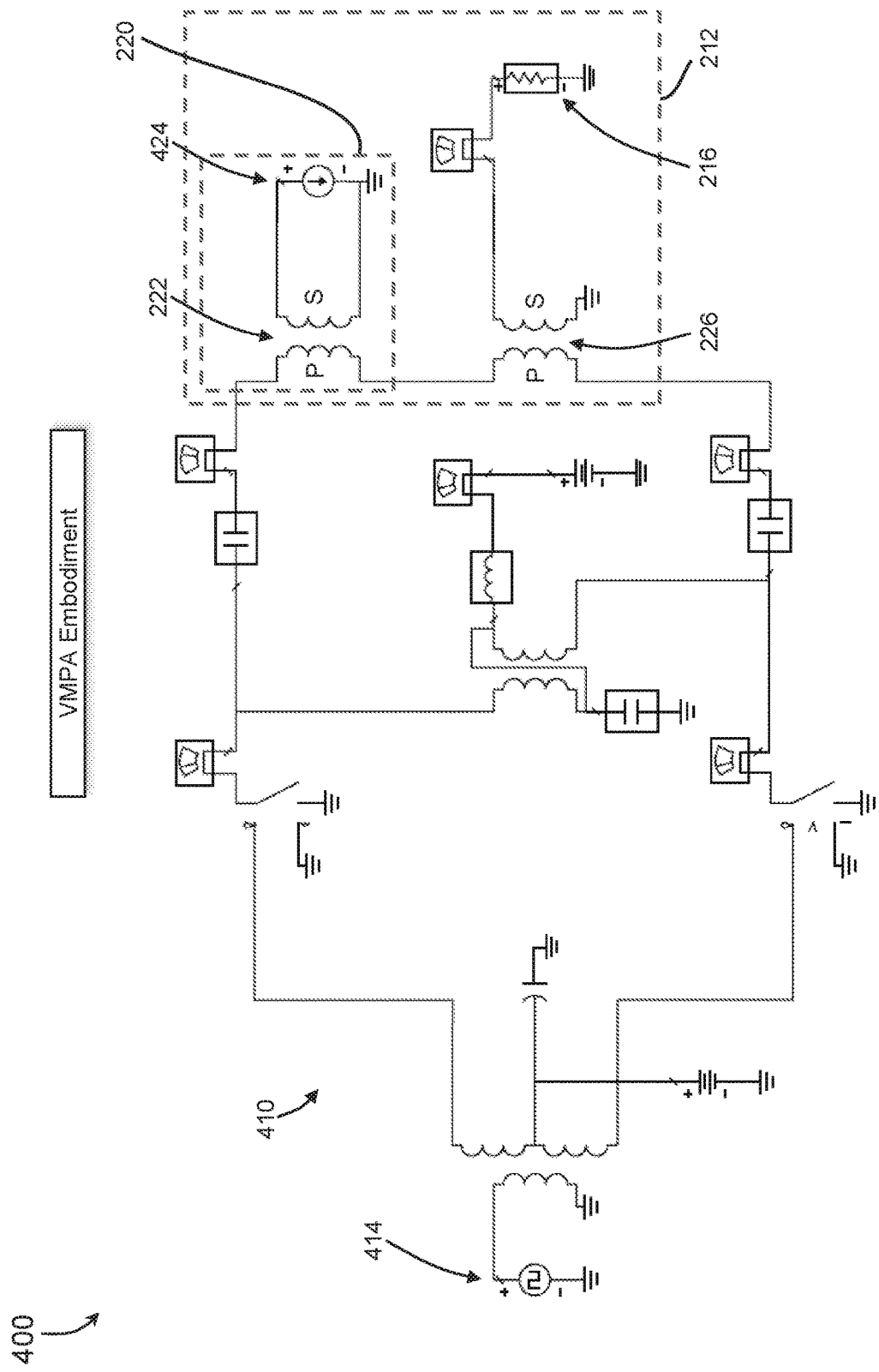
FIGS. 4A-4C are diagrams of a filterless VMPA exemplary of one embodiment of the inventive concepts disclosed herein.
Figure 4B:
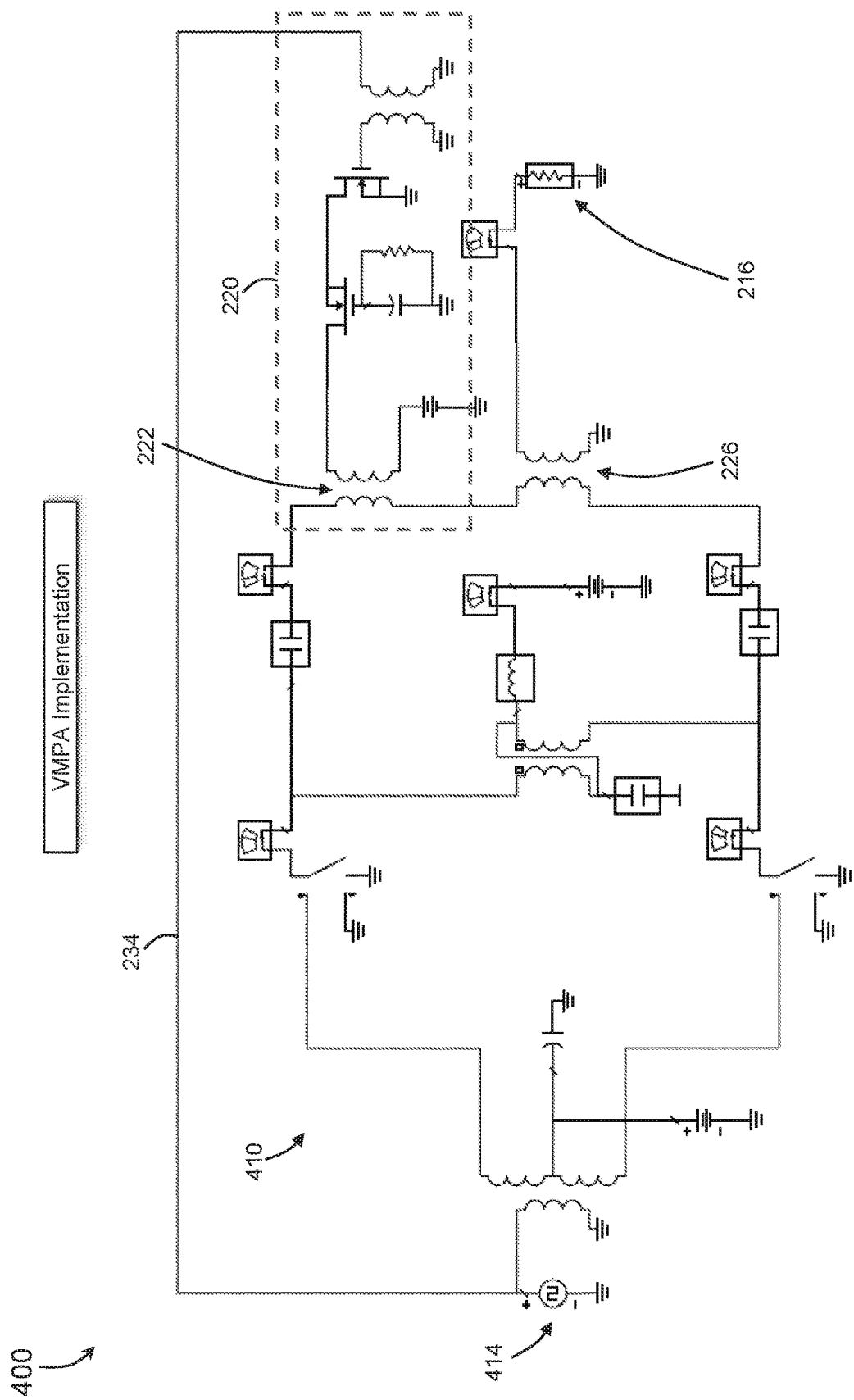
Figure 4C:
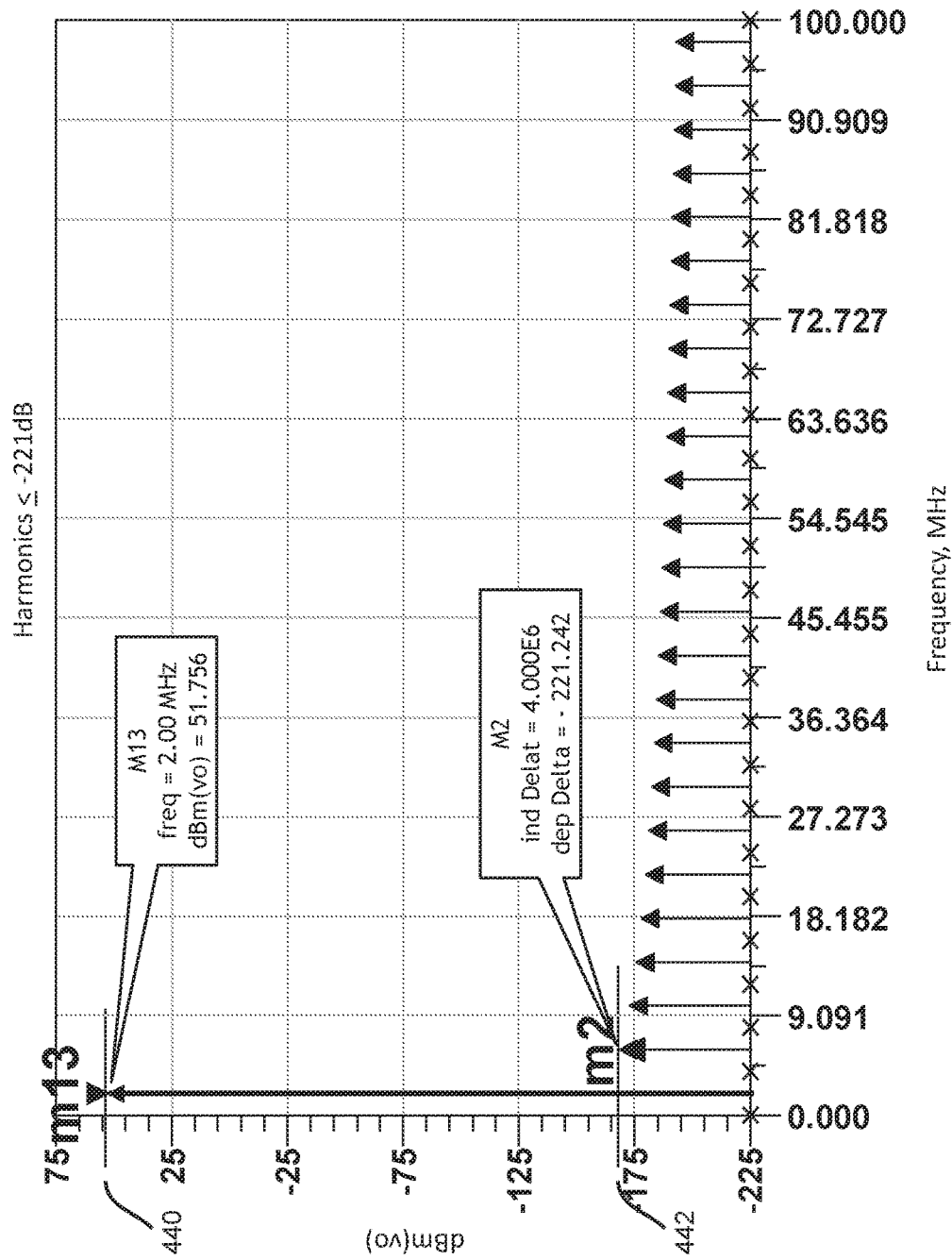

Referring now to FIGS. 4A-C, diagrams of a filterless VMPA exemplary of one embodiment of the inventive concepts disclosed herein are shown. In a VMPA embodiment 400, similar to the CMPA embodiment 200, the operational harmonic block 220 may function similarly to eliminate each undesirable harmonic from a fundamental voltage. However, as opposed to a switching current present at the CMPA drains of the transformers 222 226, now present in the VMPA embodiment 400, are switching voltages. Here, half-sinusoidal currents may pass through the transformers 222 226.

FIG. 4A may detail one embodiment of the inventive concepts disclosed herein. A VMPA 410 may function to amplify the signal from an VMPA current source 414. In one embodiment of the inventive concepts disclosed herein, the VMPA embodiment 400 may include the first transformer 222 and the second transformer 226 however here, they may be in series. Here, the first transformer 222 may function to oppose the even harmonics, and pass the odd harmonics.

In one embodiment of the inventive concepts disclosed herein, the VMPA embodiment 400 may include an ideal current source 424 functional as a high impedance to the odd harmonics, eliminating the odd harmonics in the output stage 212. The fundamental current source 424 may be set to the same frequency and amplitude as the VMPA current source 414, but may be opposite in phase, leaving only fundamental current in the primary of the first transformer 222.

The sinusoidal current in the primary of the second transformer 226 may be the same as that in the first transformer 222, resulting in only the fundamental across the load 216. Since the transformers 222 226 are in series, the current may pass through both transformers 222 226 allowing the clean output signal to superimpose to the secondary side of the second transformer 226 and pass a pure sinusoid to the load 216.

FIG. 4B may indicate one exemplary implementation of the VMPA embodiment 400. The ideal current source 424 may be implemented using a cascode amplifier, characterized by its very high output impedance and current sourcing capability. In one embodiment, the ideal current source may be driven by the connector 234 and derived by sensing the input radio frequency to the amplifier prior to a signal squaring. Here also, the ideal current source may be the VMPA current 414 via the connector 234 removing a requirement for a separate ideal current source 424.

FIG. 4C may indicate one possible result from an implementation of the VMPA embodiment 400. FIG. 4C may also indicate a delta, as a result of the operational harmonic block 220 and the second transformer 226, between a fundamental 440 and a first harmonic 442 of approximately 221 dBm. At an exemplary VMPA 210 source frequency of 2 MHz, the indicated delta may present a clean signal to the load 216.

Applying the operational harmonic block 220, the VMPA 410 may function to suppress each of the harmonics leaving the fundamental voltage. With a delta of greater than 220 dB, the operational harmonic block 220 may function to eliminate each of the even and odd harmonics from the fundamental current and offer a desirable delta between the fundamental (m13) and the nearest harmonic (m2) offering a clean output waveform to the load 216.

FIG. 5 Method

Referring now to FIG. 5, a diagram of a method flow in accordance with one embodiment of the inventive concepts disclosed herein is shown. A method 500 for filterless high efficiency power amplification may include, at a step 502, amplifying a signal to a load without a filter, the amplified signal having a fundamental frequency and at least one harmonic current.

Here, at a position proximal with an output stage prior to the load, the method may include, at a step 504, blocking at least one even harmonic current of the at least one harmonic current, and, at a step 506, the method may include passing at least one odd harmonic current of the at least one harmonic current.

To eliminate the odd harmonics, the method may include, at a step 508, with generating a sinusoid at the fundamental frequency and, at a step 510, shunting the at least one odd harmonic current to a ground. To present the clean signal to the load the method may include, at a step 512, with superimposing the fundamental frequency to the load and, at a step 514, passing only a fundamental signal at a primary harmonic current to the load.

In one embodiment of the inventive concepts disclosed herein, amplifying the signal to the load without a filter may further comprises amplifying via one of a current mode amplification and a voltage mode amplification. Another embodiment may include applying an in-phase current and an in-phase voltage to the signal to block the even harmonic. Further the method may include presenting one of an out-of-phase current and an out-of-phase voltage to the signal to shunt the odd harmonic to ground.

CONCLUSION

As will be appreciated from the above description, embodiments of the inventive concepts disclosed herein may provide a novel solution to eliminating a filter from a PA and implementing a powered block of the undesirable harmonics.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A filterless high efficiency power amplification device, comprising:
    a power amplifier (PA) configured to amplify a signal to a load, the PA having an output stage for the amplified signal without a filter, the amplified signal having a fundamental frequency and at least one harmonic current;
    an operational harmonic block coupled with the output stage of the PA, the operational harmonic block including:
        a first transformer coupled to the output path of the PA, the first transformer configured to block at least one even harmonic current of the at least one harmonic current;
        the first transformer further configured to pass at least one odd harmonic current of the at least one harmonic current;
        an ideal source having a low impedance and coupled with the first transformer, the ideal source generating a sinusoid at the fundamental frequency, the ideal source configured to shunt the at least one odd harmonic current to a ground; and
    a second transformer coupled with the output path in one of parallel and series with the first transformer and at a point downstream of the operational harmonic block, the second transformer configured to superimpose the fundamental frequency to the load;
    wherein the operational harmonic block is configured to pass only a fundamental signal at a primary harmonic current to the load via the second transformer.

2. The filterless high efficiency power amplification device of claim 1, wherein the PA is one of a Current Mode PA (CMPA) and a Voltage Mode PA (VMPA).

3. The filterless high efficiency power amplification device of claim 2, wherein the ideal source is one of an ideal voltage source within the CMPA and an ideal current source within the VMPA.

4. The filterless high efficiency power amplification device of claim 1, wherein the first transformer and the second transformer each function as a balun.

5. The filterless high efficiency power amplification device of claim 1, wherein the operational harmonic block is further configured as an operational two-stage cascode amplifier.

6. The filterless high efficiency power amplification device of claim 1, wherein the ideal source is coupled with the PA and is configured to sense an amplitude, a phase and a frequency of the signal and produce an ideal signal matching the signal.

7. The filterless high efficiency power amplification device of claim 1, further including a connector coupling the operational harmonic block with the PA and wherein the operational harmonic block receives one of a CMPA voltage source and a VMPA current source usable as the ideal source.

8. The filterless high efficiency power amplification device of claim 1, wherein the filterless high efficiency power amplification device maintains a high frequency agility over a wide frequency range.

9. The filterless high efficiency power amplification device of claim 1, wherein the even harmonic currents are in phase with the signal and the odd harmonic currents are out of phase with the signal.

10. The filterless high efficiency power amplification device of claim 1, wherein the fundamental frequency is arbitrary.

11. The filterless high efficiency power amplification device of claim 1, wherein a delta, at the load, between the fundamental frequency at a primary harmonic and a first harmonic current is at least 220 dBm.

12. A method for filterless high efficiency power amplification, comprising:
  amplifying a signal to a load without a filter, the amplified signal having a fundamental frequency and at least one harmonic current;
  at a position proximal with an output stage prior to the load:
    blocking at least one even harmonic current of the at least one harmonic current;
    passing at least one odd harmonic current of the at least one harmonic current;
    generating a sinusoid at the fundamental frequency;
    shunting the at least one odd harmonic current to a ground via the generated sinusoid;
    superimposing the fundamental frequency to the load; and
    passing only a fundamental signal at a primary harmonic current to the load.

13. The method for filterless high efficiency power amplification of claim 12, wherein amplifying a signal to a load without a filter further comprises amplifying via one of a current mode amplification and a voltage mode amplification.

14. The method for filterless high efficiency power amplification of claim 12, wherein blocking at least one even harmonic current further comprises applying one of an in-phase current and an in-phase voltage to the signal.

15. The method for filterless high efficiency power amplification of claim 12, wherein shunting the at least one odd harmonic current to a ground further comprises presenting one of an out-of-phase current and an out-of-phase voltage to the signal.

* * * * *